United States Patent
Oh et al.

(10) Patent No.: US 11,861,483 B2
(45) Date of Patent: Jan. 2, 2024

(54) SPIKE NEURAL NETWORK CIRCUIT INCLUDING COMPARATOR OPERATED BY CONDITIONAL BIAS CURRENT

(71) Applicant: ELECTRONICS AND TELECOMMUNICATIONS RESEARCH INSTITUTE, Daejeon (KR)

(72) Inventors: Kwang IL Oh, Daejeon (KR); Sung Eun Kim, Daejeon (KR); Seong Mo Park, Daejeon (KR); Young Hwan Bae, Daejeon (KR); Jae-Jin Lee, Daejeon (KR); In Gi Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 1035 days.

(21) Appl. No.: 16/688,746

(22) Filed: Nov. 19, 2019

(65) Prior Publication Data

US 2020/0160146 A1 May 21, 2020

(30) Foreign Application Priority Data

Nov. 20, 2018 (KR) .................. 10-2018-0143981
Apr. 11, 2019 (KR) .................. 10-2019-0042294

(51) Int. Cl.
*G06N 3/049* (2023.01)
*G06N 3/063* (2023.01)
(Continued)

(52) U.S. Cl.
CPC ............. *G06N 3/049* (2013.01); *G06N 3/063* (2013.01); *G06N 3/08* (2013.01); *H03K 5/2472* (2013.01)

(58) Field of Classification Search
CPC .......... G06N 3/049; G06N 3/063; G06N 3/08; G06N 3/0635; H03K 5/2472
See application file for complete search history.

(56) References Cited

U.S. PATENT DOCUMENTS 8,433,665 B2  4/2013  Tang et al.
9,053,428 B2  6/2015  Hunzinger et al.
(Continued)

FOREIGN PATENT DOCUMENTS

KR   20130036318 A   4/2013
KR   20140141778 A   12/2014
(Continued)

OTHER PUBLICATIONS

Hsieh, H. Y., & Tang, K. T. (2012). VLSI implementation of a bio-inspired olfactory spiking neural network. IEEE transactions on neural networks and learning systems, 23(7), 1065-1073. (Year: 2012).*

(Continued)

*Primary Examiner* — Kamran Afshar
*Assistant Examiner* — Henry Trong Nguyen

(57) ABSTRACT

Provided is a spike neural network circuit including a synapse configured to generate an operation signal based on an input spike signal and a weight, and a neuron configured to generate an output spike signal using a comparator configured to compare a voltage of a membrane signal generated based on the operation signal with a voltage of a threshold signal, wherein the comparator includes a bias circuit configured to conditionally supply a bias current of the comparator depending on the membrane signal.

17 Claims, 9 Drawing Sheets

(51) Int. Cl.
    *G06N 3/08*     (2023.01)
    *H03K 5/24*     (2006.01)

(56) References Cited

U.S. PATENT DOCUMENTS

| | | | |
|---|---|---|---|
| 9,244,102 | B2 | 1/2016 | Kikuchi |
| 9,418,333 | B2 | 8/2016 | Kim et al. |
| 9,805,302 | B2 | 10/2017 | Kim et al. |
| 2012/0011091 | A1 | 1/2012 | Aparin et al. |
| 2017/0185891 | A1 | 6/2017 | Hosokawa et al. |
| 2017/0243108 | A1 | 8/2017 | Ritter et al. |
| 2017/0329575 | A1* | 11/2017 | Gu ............... G11C 11/54 |
| 2018/0211165 | A1 | 7/2018 | Oh et al. |
| 2018/0232635 | A1 | 8/2018 | Oh et al. |
| 2018/0260696 | A1* | 9/2018 | Suda ............... G06N 3/049 |

FOREIGN PATENT DOCUMENTS

| | | | |
|---|---|---|---|
| KR | 20140144130 A | 12/2014 |
| KR | 101512370 B1 | 4/2015 |
| KR | 101596656 B1 | 2/2016 |

OTHER PUBLICATIONS

Wang et al., "Programmable Synaptic Weights for an aVLSI Network of Spiking Neurons", ISCAS, 2006, pp. 4531-4534, IEEE.

X. Wu, et al. "A CMOS Spiking Neuron for Brain-Inspired Neural Networks With Resistive Synapses and In Situ Learning", IEEE Transactions on Circuits and Systems-II: Express Briefs, vol. 62, No. 11, Nov. 2015.

\* cited by examiner

SPIKE NEURAL NETWORK CIRCUIT INCLUDING COMPARATOR OPERATED BY CONDITIONAL BIAS CURRENT

CROSS-REFERENCE TO RELATED APPLICATIONS

This U.S. non-provisional patent application claims priority under 35 U.S.C. § 119 of Korean Patent Applications Nos. 10-2018-0143981, filed on Nov. 20, 2018, and 10-2019-0042294, filed on Apr. 11, 2019, the entire contents of which are hereby incorporated by reference.

BACKGROUND

The present disclosure herein relates to a spike neural network circuit, and more specifically, to a spike neural network circuit including a comparator operated by a conditional bias current.

An artificial neural network (ANN) is capable of processing data or information in a similar manner to a biological neural network. Unlike a perceptron-based neural network or a convolution-based neural network, in a spike neural network, a spike signal having a pulse form and toggling for a short period of time, not a signal of a specific level, may be transmitted.

A spike neural network may be implemented using a semiconductor device. In recent years, as the spike neural network has been used in various fields, the number of neurons integrated into the spike neural network is increased, thereby increasing the consumption of power consumed by the spike neural network.

SUMMARY

The present disclosure provides a spike neural network circuit including a comparator operated by a conditional bias current.

An embodiment of the inventive concept provides a spike neural network circuit including a synapse configured to generate an operation signal based on an input spike signal and a weight, and a neuron configured to generate an output spike signal using a comparator configured to compare a voltage of a membrane signal generated based on the operation signal with a voltage of a threshold signal, wherein the comparator includes a bias circuit configured to conditionally supply a bias current of the comparator depending on the membrane signal.

In an embodiment of the inventive concept, a spike neural network circuit includes a synapse configured to generate an operation signal based on an input spike signal and a weight, and a neuron configured to generate an output spike signal using a comparator configured to compare a current of a membrane signal generated based on the operation signal with a bias current generated based on a bias signal, wherein the comparator includes a bias circuit configured to conditionally supply the bias current of the comparator depending on the membrane signal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the inventive concept will be described clearly and in detail so that those skilled in the art may easily carry out the inventive concept.

The inventive concept relates to a circuit implemented in a semiconductor device in order to perform an operation of a neural network. A neural network of the inventive concept may be an artificial neural network (ANN) capable of processing data or information in a similar manner to a biological neural network. The neural network may include multiple layers including artificial neurons similar to biological neurons, and synapses for connecting the multiple layers. Hereinafter, a spike neural network that processes a spike signal having a pulse form and toggling for a short period of time will be representatively described. However, a circuit according to an embodiment of the inventive concept is not limited to a spike neural network, and may be used to implement other neural networks.

Figure 1:
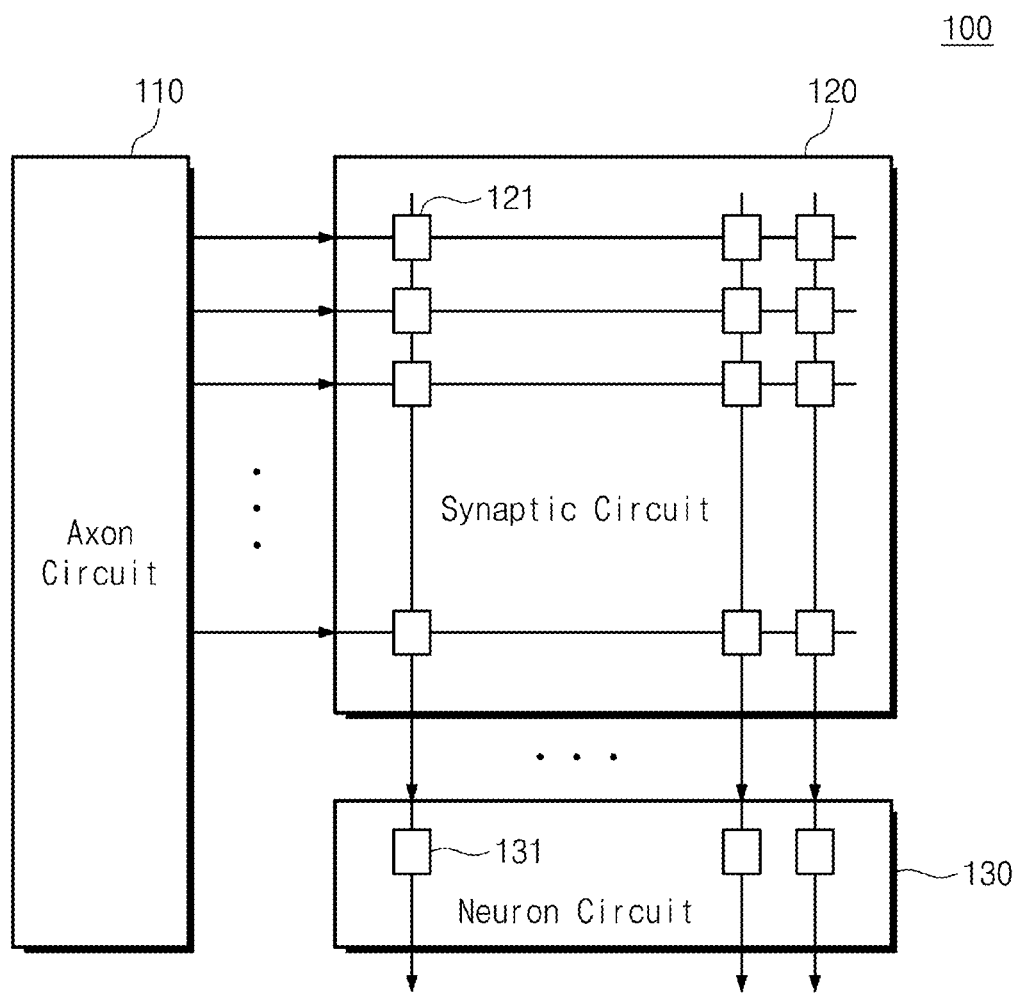
FIG. 1 is a block diagram exemplarily illustrating a spike neural network circuit according to an embodiment of the inventive concept.

FIG. 1 is a block diagram exemplarily illustrating a spike neural network circuit according to an embodiment of the inventive concept. A spike neural network circuit 100 may include an axon circuit 110, a synaptic circuit 120, and a neuron circuit 130.

The axon circuit 110 may include axons generating input spike signals. Similar to an axon of a biological neural network, an axon of the axon circuit 110 may perform a function of outputting a signal to another neuron. For example, each of the axons of the axon circuit 110 may generate an input spike signal based on data or information input to the spike neural network circuit 100 from the outside. In another example, each of the axons of the axon circuit 110 may first receive output spike signals output from the neuron circuit 130 depending on input spike signals transmitted to the synaptic circuit 120, and then generate a new input spike signal based on feedback output spike signals. The input spike signal may be a pulse signal toggling for a short period of time. The axon circuit 110 may generate input spike signals and transmit the input spike signals to the synaptic circuit 120.

The synaptic circuit 120 may connect the axon circuit 110 to the neuron circuit 130. The synaptic circuit 120 may include synapses 121 determining (deciding) the connection and the connection strength of the axons of the axon circuit 110 and neurons of the neuron circuit 130. Each of the synapses 121 may have a unique or a variable weight. Each of the synapses 121 may receive an input spike signal, and apply a weight to the input spike signal. The weight may be a numerical value representing the correlation between the axon and the neuron described above, the connection strength between the axons of the axon circuit 110 and the neurons of the neuron circuit 130, the correlation of a (subsequent) neuron of the neuron circuit 130 with respect to an input spike signal. Each of the synapses 121 may output a weight to the neuron circuit 130 depending on an input spike signal. Each of the synapses 121 generates an operation signal based on the input spike signal and the weight, and output the operation signal to the neuron circuit 130.

The spike neural network circuit 100 may include a plurality of layers each including multiple neurons. Some of the synapses 121 of the synaptic circuit 120 may represent the correlation between a first layer and a second layer, and the other synapses 121 of the synaptic circuit 120 may represent the correlation between a third layer and a fourth layer. That is, the synapses 121 of the synaptic circuit 120 may represent correlations between different layers.

Referring to FIG. 1, the synapses 121 are illustrated as being disposed on a two-dimensional array. Input spike signals may be transmitted in a first direction toward the synaptic circuit 120 from the axon circuit 110. An operation signal in which an input spike signal is applied with a weight (that is, an operation result) may be transmitted in a second direction toward the neuron circuit 130 from the synaptic circuit 120. For example, the first direction and the second direction may be perpendicular to each other. However, unlike what is shown in FIG. 1, the synapses 121 may be disposed on a three-dimensional array.

Neurons 131 of the neuron circuit 130 may respectively receive operation signals in which input spike signals are applied with weights in the synaptic circuit 120. Similar to a dendrite of a biological neural network, each of the neurons 131 may perform a function of receiving a signal output from a different neuron. Referring to FIG. 1, each of the neurons 131 may be connected to the synapses 121 disposed along the second direction, and may receive operation signals output from the synapses 121. In each of the neurons 131, the operation signals of the synapses 121 disposed along the second direction may be accumulated. However, the number, arrangement, and the like of the synapses 121 connected to each of the neurons 131 are not limited to those shown in FIG. 1.

Each of the neurons 131 may compare a sum signal in which the operation signals of the synapses 121 are accumulated with a threshold signal (that is, a reference signal) and generate an output spike signal when the sum signal is greater than the threshold signal (that is, fire of a neuron). Output spike signals of the neuron circuit 130 may be provided back to the axon circuit 110, may be output to the outside of the spike neural network circuit 100, or may be output to another component of the spike neural network 100.

Figure 2:
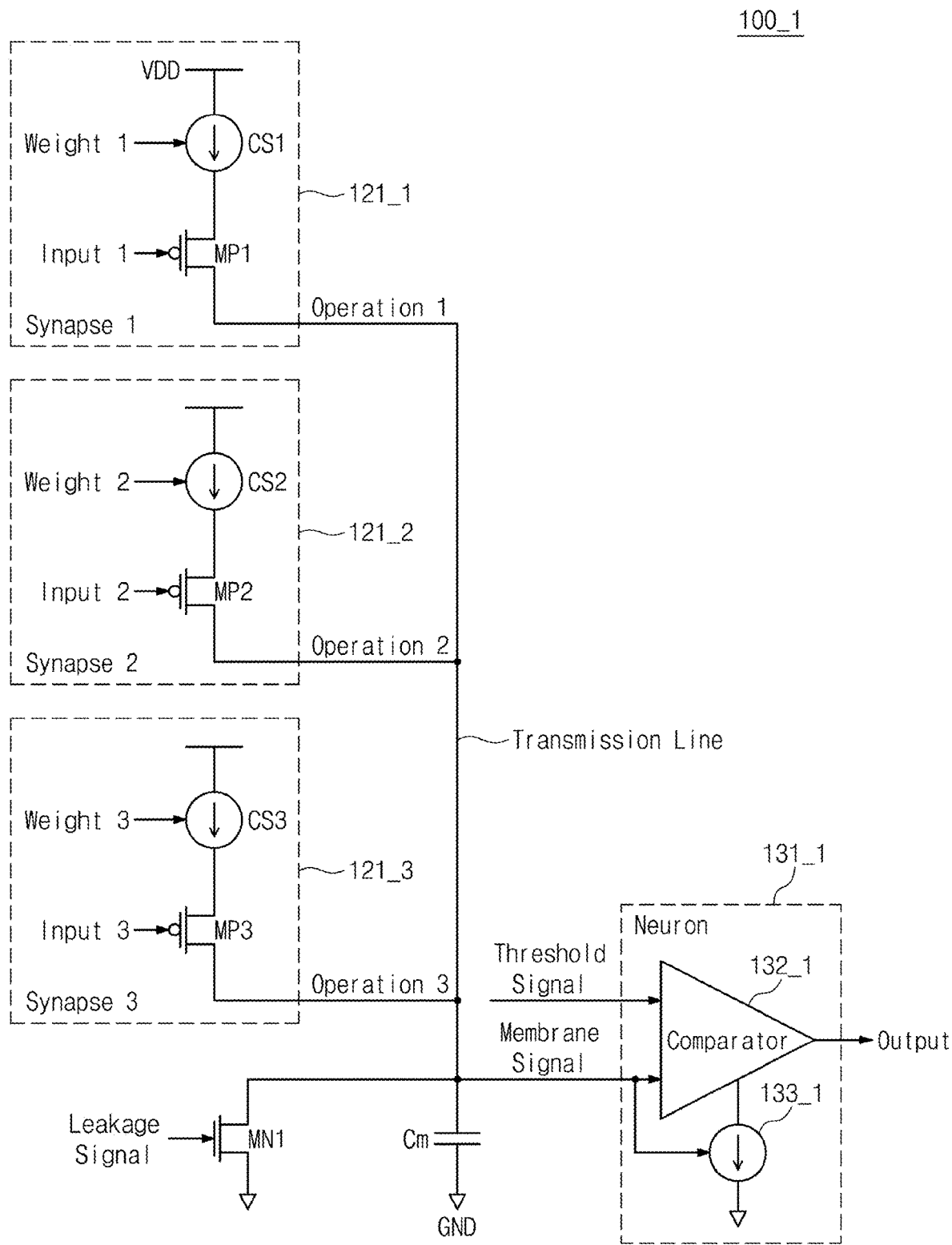
FIG. 2 is a block diagram more specifically illustrating synapses of a synaptic circuit and neurons of a neuron circuit shown in FIG. 1.

FIG. 2 is a block diagram more specifically illustrating synapses of a synaptic circuit and neurons of a neuron circuit shown in FIG. 1. FIG. 2 will be described with reference to FIG. 1. A spike neural network circuit 100_1 may include first to third synapses 121_1 to 121_3 and a neuron 131_1. The spike neural network circuit 100_1 is the spike neural network circuit 100 of FIG. 1. For convenience of description, the axon circuit 110 is not shown, and only some synapses 121_1, 121_2, and 121_3 of the synaptic circuit 120 are shown in FIG. 2. In addition, only one neuron 131_1 of the neuron circuit 130 is shown in FIG. 2.

A first synapse 121_1 may include a transistor MP1 and a current source CS1. The current source CS1 receives a first weight (Weight 1), and may generate a current corresponding to the first weight. For example, the current source CS1 may be a transistor connected between a power supply voltage VDD and the transistor MP1. A transistor of the current source CS1 may receive a voltage representing the first weight through a gate terminal. A source terminal of the transistor of the current source CS1 may be connected to the power supply voltage VDD. A drain terminal of the transistor of the current source CS1 may be connected to a source terminal of the transistor MP1. The source terminal and the drain terminal of the transistor may be referred to as a first end or a second end, respectively. The current source CS1 may output the current corresponding to the first weight to the transistor MP1.

The transistor MP1 may receive a first input spike signal (Input 1: for example, a negative pulse) through a gate terminal. A source terminal of the transistor MP1 may be connected to the current source CS1. A drain terminal of the transistor MP1 may be connected to a transmission line. The transistor MP1 may be a switch which is turned on or turned off depending on the first input spike signal. When the transistor MP1 is turned on depending on the first input spike signal, the transistor MP1 may output a current which is output from the current source CS1 depending on the first input spike signal, that is, an operation signal, to the transmission line. The first synapse 121_1 may generate a first operation signal (Operation 1) based on the first input spike signal and the first weight. The first operation signal may be determined by the product of the first input spike signal and the first weight.

In an embodiment, the transistor MP1 is illustrated as being a p-channel metal-oxide semiconductor (PMOS). However, the embodiment of the inventive concept is not limited thereto. A PMOS, an n-channel metal-oxide semiconductor (NMOS), or a combination of the PMOS and the NMOS may be implemented as the switch. The transistor of the current source CS1 may also be a PMOS, an NMOS, or a combination of the PMOS and the NMOS.

In an embodiment, the first synapse 121_1 may further include a digital-to-analog converter (DAC). The DAC of the first synapse 121_1 may receive digital bits representing the first weight and output a voltage representing the first weight to the current source CS1. The first synapse 121_1 may further include a register, a memory cell (for example, a static random access memory (SRAM) cell, a dynamic random access memory (DRAM) cell, a latch, a NAND flash memory cell, a NOR flash memory cell, a resistive random access memory (RRAM) cell, a ferroelectric random access memory (FRAM) cell, a phase change random access memory (PRAM) cell, and a magnetic random access memory (MRAM) cell), and the like for storing digital bits.

In an embodiment, as shown in FIG. 2, the first synapse 121_1 may include only the current source CS1 and the transistor MP1, and the above-described DAC and the registers or the memory cells for storing digital bits are included in a semiconductor device in which the spike neural network 100 is implemented, but may be separated from the synaptic circuit 120. In this case, the DAC separated from the synaptic circuit 120 may transmit a voltage representing a weight to the synaptic circuit 120, or the registers or the memory cells for storing digital bits may transmit the digital bits to the synaptic circuit 120. In any case, the current source CS1 of the first synapse 121_1 may receive the voltage representing the first weight.

A second synapse 121_2 may be implemented in the same manner as the first synapse 121_1. The second synapse 121_2 may receive a voltage representing a second weight (Weight 2), and may receive a second input spike signal (Input 2). The second synapse 121_2 may generate a second operation signal (Operation 2) based on the second input spike signal and the second weight. A third synapse 121_3 may be implemented in the same manner as the first synapse 121_1. The third synapse 121_3 may receive a voltage representing a third weight (Weight 3), and may receive a third input spike signal (Input 3). The third synapse 121_3 may generate a third operation signal (Operation 3) based on the third input spike signal and the third weight. Here, the first to third weights may be the same or different from each other. The first to third input spike signals may also be the same or different from each other.

The neuron 131_1 may include a comparator 132_1 which compares a membrane signal (a sum signal) in which operation signals output from the first to three synapses 121_1 to 121_3 are combined and a threshold signal. The membrane signal may be generated based on the operation signals. The comparator 132_1 may compare a voltage Vm of the membrane signal with a voltage Vth of the threshold signal. The neuron 131_1 may generate an output spike signal (an output) based on a comparison result of the comparator 132_1. For example, the neuron 131_1 may output an output spike signal when the voltage Vm of the membrane signal becomes greater (higher) than the voltage Vth of the threshold signal or when the voltage Vm of the membrane signal reaches the voltage Vth of the threshold signal (fire). In another example, the neuron 131_1 may output an output spike signal when the voltage Vm of the membrane signal becomes smaller (lower) than the voltage Vth of the threshold signal or when the voltage Vm of the membrane signal reaches the voltage Vth of the threshold signal (fire).

The neuron 131_1 may include a bias circuit 133_1. The bias circuit 133_1 may conditionally supply a bias current to the comparator 132_1 depending on the membrane signal. The comparator 132_1 may perform a comparison operation based on the bias current and may be operated by the bias current. The bias circuit 133_1 may be implemented separated from the comparator 132_1, or may be included in the comparator 132_1. Since the spike neural network circuit 100 is operated based on an input spike signal and an output spike signal, an interval (period, section, etc.) in which the voltage Vm of the membrane signal is greater than the voltage Vth of the threshold signal is shorter than an interval in which the voltage Vm of the membrane signal is smaller (less) than the voltage Vth of the threshold signal. The neuron 131_1 may be operated in most of the interval in which the voltage Vm of the membrane signal is smaller than the voltage Vth of the threshold signal, and the comparison operation of the neuron 131_1 is only required when the voltage Vm of the membrane signal is relatively high.

The bias circuit 133_1 may not continuously supply (provide) the bias circuit. The bias circuit 133_1 may not supply the bias current to the comparator 132_1 when the voltage Vm of the membrane signal is relatively low, and may supply the bias current to the comparator 132_1 when the voltage Vm of the membrane signal is relatively high. As a result, a current and a voltage consumed in the comparator 132_1 may be reduced or minimized. Particularly, as the number of the neurons 131 of the neuron circuit 130 is increased, the current and voltage reduction described above is more effective. The bias current is conditionally supplied according to an operation condition (a voltage level of the membrane signal), and thus, may be referred to as a conditional bias current, and the bias circuit 133_1 may be referred to as a conditional bias circuit.

The spike neural network circuit 100_1 may include a capacitor Cm in which charges are accumulated (integrated) by the first to third operation signals (currents) output from the first to third synapses 121_1 to 121_3. A first end of the capacitor Cm may be connected to the first to third synapses 121_1 to 121_3, and a second end of the capacitor Cm may be connected to a power supply voltage (ground voltage) GND. The capacitor Cm may be charged by currents output from the first to third synapses 121_1 to 121_3 and corresponding to the first to third weights. The voltage Vm of the capacitor Cm is the voltage Vm of the membrane signal, and may be a value in which currents output from the first to third synapses 121_1 to 121_3 are accumulated. The voltage Vm of the capacitor Cm may be a value determined by the first to third weights output from the first to third synapses 121_1 to 121_3 to the first to third input spike signals. The voltage Vm of the capacitor Cm may be provided to the neuron 131_1. The number of synapses connected to the capacitor Cm through the transmission line is illustrated as being 3 in FIG. 2. However, the embodiment of the present invention is not limited thereto. The spike neural network circuit 100 may further include other capacitors in which charges are accumulated by currents output from other synapses. The capacitor Cm may be referred to as a membrane capacitor or a membrane.

The spike neural network circuit 100_1 may include a transistor MN1 which discharges the charges accumulated in the capacitor Cm depending on a leakage signal. The transistor MN1 may receive the leakage signal through a gate terminal. The transistor MN1 may be connected between the capacitor Cm and the power supply voltage GND. The transistor MN1 may be connected to the capacitor Cm in parallel. The transistor MN1 may control the rate (speed) at which operation signals output from the first to third synapses 121_1 to 121_3 are accumulated in the capacitor Cm. A voltage of the leakage signal may be pre-defined. The transistor MN1 is illustrated as being an NMOS in FIG. 2, but may be implemented using a PMOS, an NMOS, or a combination of the PMOS and the NMOS.

In an embodiment, unlike what is shown in FIG. 2, transistors MP1 to MP3 and CS1 to CS3 of the first to third synapses 121_1 to 121_3 may each be implemented using an n-channel metal-oxide semiconductor (NMOS) connected between a transmission line and the power supply voltage GND. In this case, the capacitor Cm may be connected between the transmission line and the power supply voltage VDD, and the transistor MN1 may be implemented using a PMOS instead of an NMOS.

Figure 3:
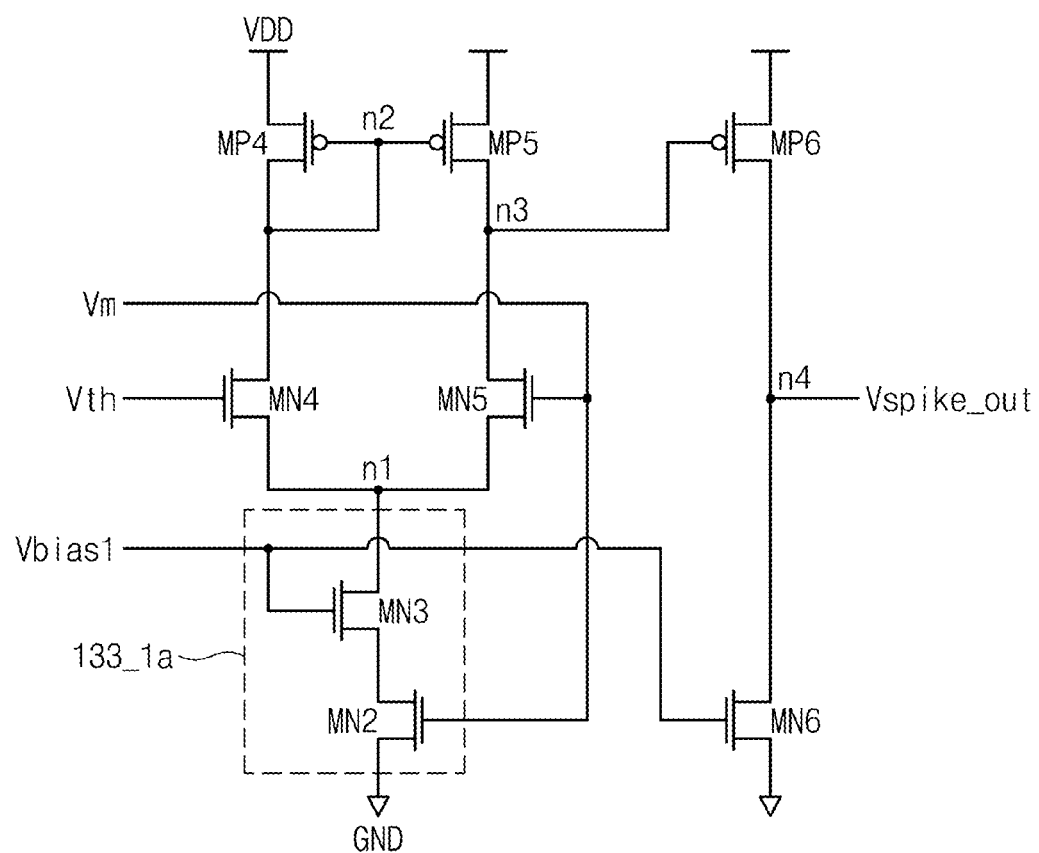
FIG. 3 exemplarily illustrates a block diagram of a comparator of FIG. 2.

FIG. 3 exemplarily illustrates a block diagram of a comparator of FIG. 2. FIG. 3 will be described with reference to FIG. 2. A comparator 132_1a may be the comparator 132_1 of FIG. 2, and a bias circuit 133_1a may be included in the comparator 132_1a, or may be the bias circuit 133_1 of FIG. 2.

The bias circuit 133_1a may include a transistor MN2 which receives the voltage Vm of the membrane signal through a gate terminal and a transistor MN3 which receives a voltage Vbias1 of a first bias signal through a gate terminal. The transistor MN2 may be turned on or turned off depending on the voltage Vm of the membrane signal. When the voltage Vm of the membrane signal is greater than a threshold voltage of the transistor MN2, the transistor MN2 may be turned on. A drain terminal of the transistor MN2 may be connected to a source terminal of the transistor MN3. A source terminal of the transistor MN2 may be connected to the power supply voltage GND. The transistor MN3 may generate a bias current based on the voltage Vbias1 of the first bias signal. A drain terminal of the transistor MN3 may be connected to a node n1 (a common node). A drain terminal of the transistor MN3 may be connected to the drain terminal of the transistor MN2. When the transistor MN2 is turned on, the bias current of the transistor MN3 may be supplied to the comparator 132_1a through the transistor MN2, and when the transistor MN2 is turned off, the bias current of the transistor MN3 may not be supplied to the comparator 132_1a through the transistor MN2. Only when the transistor MN2 is turned on, the bias current of the transistor MN3 may flow through the transistor MN2, and power may be consumed by the bias current and the power supply voltage VDD. Here, the power supply voltage VDD of the comparator 132_1a may be the same as the power supply voltage VDD of the synapses 121 or may be different therefrom.

Referring to FIG. 3, the transistors MN2 and MN3 may be connected in series. Unlike what is shown in FIG. 3, the transistor MN2 may be connected between the node n1 and the transistor MN3, and the transistor MN3 may be connected between the transistor MN2 and the power supply voltage GND. The transistors MN2 and MN3 may be implemented using an NMOS, a PMOS, or a combination of the NOMS and the PMOS.

The comparator 132_1a may include a transistor MN4 which receives the threshold signal through a gate terminal and a transistor MN5 which receives the membrane signal through a gate terminal. Source terminals of the transistors MN4 and MN5 may be commonly connected to the node n1. A drain terminal of the transistor MN4 may be connected to a node n2. A drain terminal of the transistor MN5 may be connected to a node n3. The transistor MN4 may generate a current flowing between the nodes n1 and n2 depending on the Vth of the threshold signal. The transistor MN5 may generate a current flowing between the nodes n1 and n3 depending on the voltage Vm of the membrane signal. The transistors MN4 and MN5 may act as a switch for performing a comparison operation for the threshold signal and the membrane signal.

The comparator 132_1a may include a transistor MP4 connected between the node n2 and the power supply voltage VDD and a transistor MP5 connected between the node n3 and the power supply voltage VDD. A gate terminal and a drain terminal of the transistor MP may be connected to each other (diode connection). A drain terminal of the transistor MP5 may be connected to the node n2. The transistors MP4 and MP5 provide a high impedance to a load terminal of the comparator 132_1a so as to increase an amplification rate of the comparator 132_1a which amplifies the difference between the voltage Vth of the threshold signal and the voltage Vm of the membrane signal. Depending on a ratio of a current flowing through the transistor MP5 and a current flowing through the transistor MN5, a voltage of the node n3 may be determined. The transistors MN2, MN3, MN4, MN5, MP4 and MP5 may configure (constitute) a first stage of the comparator 132_1a.

The comparator 132_1a may include a transistor MN6 which receives a bias signal through a gate terminal and a transistor MP6 which receives the voltage of the node n3 through a gate terminal. A drain terminal of the transistor MN6 may be connected to a node n6. A source terminal of the transistor MN6 may be connected to the power supply voltage GND. A drain terminal of the transistor MP6 may be connected to the node n6. A source terminal of the transistor MP6 may be connected to the power supply voltage VDD. The transistors MN6 and MP6 may configure a second stage of the comparator 132_1a. In a node n4, an output spike signal may be generated.

A voltage Vspike_out of the output spike signal may be determined according to the result of comparing the voltage Vm of the membrane signal with the voltage Vth of the threshold signal. When the voltage Vm of the membrane signal reaches the voltage Vth of the threshold signal, a logic value of the voltage Vspike_out of the output spike signal is changed from a first value (for example, low) to a second value (for example, high) (or vice versa), so that the output spike signal may be activated and fired.

In an embodiment, types of the transistors of FIG. 3 are not limited to those shown in FIG. 3. Also, the logic value of the output spike signal is not limited to the example described above.

Figure 4:
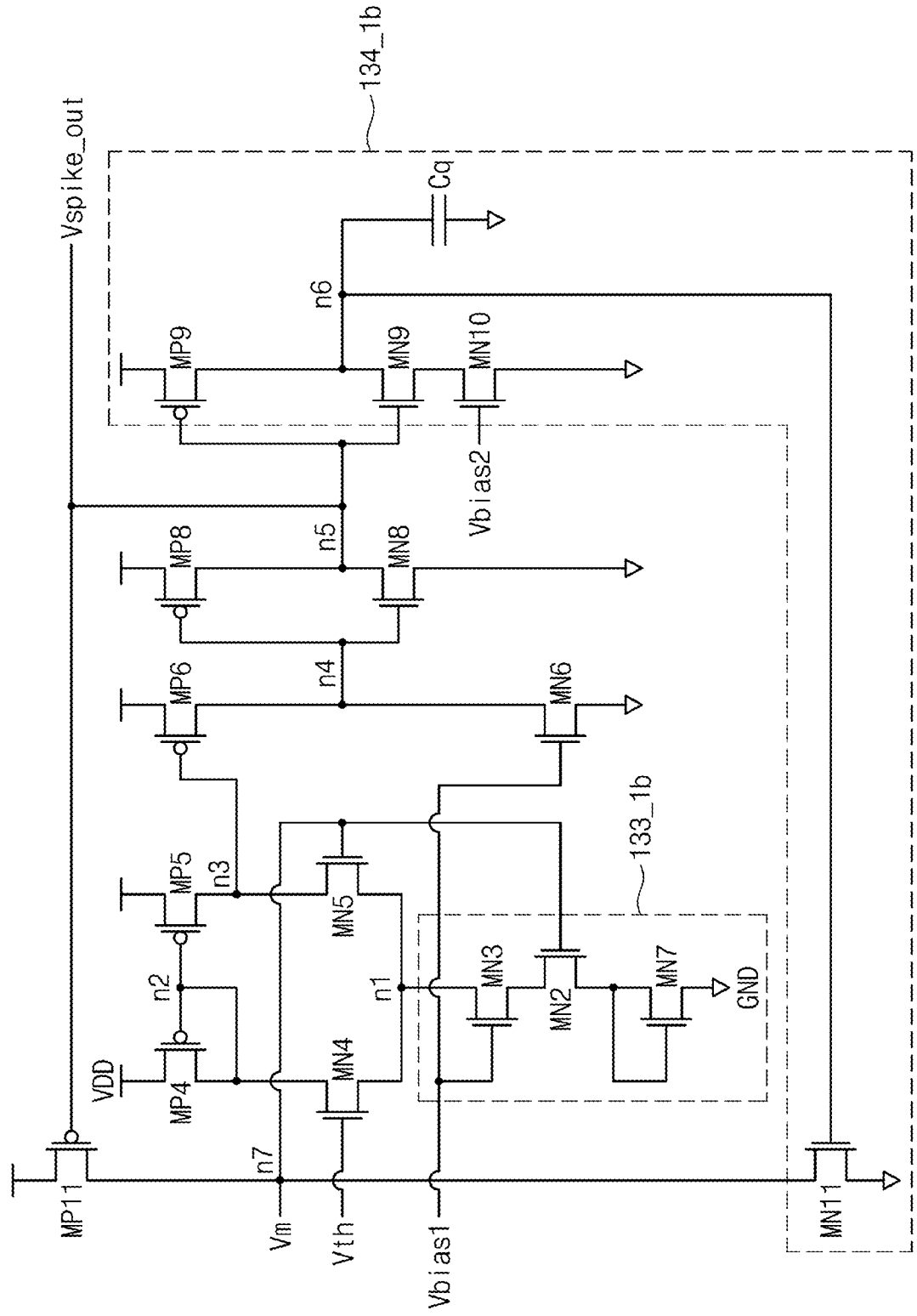
FIG. 4 exemplarily illustrates a block diagram of the comparator of FIG. 2.

FIG. 4 exemplarily illustrates a block diagram of the comparator of FIG. 2. FIG. 4 will be described with reference to FIG. 2 and FIG. 3. A comparator 132_1b may be the comparator 132_1 of FIG. 2, and a bias circuit 133_1b may be included in the comparator 132_1b, or may be the bias circuit 133_1 of FIG. 2. Differences between the comparator 132_1b and the comparator 132_1a will be mainly described, and the description of components having the same reference numerals will be omitted.

The bias circuit 133_1b may further include a transistor MN7 connected between the transistor MN2 and the power supply voltage GND. A gate terminal and a drain terminal of the transistor MN7 may be connected to each other (diode connection). The source terminal of the transistor MN2 may be connected to the drain terminal of the transistor MN7 instead of the power supply voltage GND. The transistor MN2 may be supplied with a voltage increased by a threshold voltage of the transistor MN7 from the power supply voltage GND instead of the power supply voltage GND. Unlike the comparator 132_1a, when the voltage Vm of the membrane signal becomes greater than the sum of the threshold voltage of the transistor MN7 and the threshold voltage of the transistor MN2, the comparator 132_1b may be supplied with a bias current through the transistors MN2 and MN7. Accordingly, an interval in which a bias current is supplied in the comparator 132_1b may be shorter than that in the comparator 132_1a. Also, the transistor MN7 may further reduce the magnitude of the bias current of the comparator 132_1b.

The comparator 132_1b may further include transistors MN8 and MP8 which configure an inverter. A transistor MN8 may receive a voltage of the node n4 through a gate terminal, and a drain terminal of the transistor MN8 may be connected to a node n5. Also, a source terminal of the transistor MN8 may be connected to the power supply voltage GND. A transistor MP8 may receive the voltage of the node n4 through a gate terminal, and a drain terminal of the transistor MP8 may be connected to the node n5. Also, a source terminal of the transistor MP8 may be connected to the power supply voltage VDD. In the node n5, an output spike signal may be generated. When the voltage Vm of the membrane signal reaches the voltage Vth of the threshold signal, the logic value of the voltage Vspike_out of the output spike signal is changed from the second value to the first value, so that the output spike signal may be activated and fired.

The comparator 132_1b may further include transistors MP9, MN9 and MN10. A transistor MP9 may receive a voltage of the node n5 through a gate terminal, and a drain terminal of the transistor MP9 may be connected to a node n6. Also, a source terminal of the transistor MP9 may be connected to the power supply voltage VDD. A transistor MN9 may receive the voltage of the node n5 through a gate terminal, and a drain terminal of the transistor MN9 may be connected to the node n6. Also, a source terminal of the transistor MN9 may be connected to a transistor MN10. The transistor MN10 may receive a voltage Vbias2 of a second bias signal through a gate terminal, and a drain terminal of the transistor MN10 may be connected to the source terminal of the transistor MN9. Also, a source terminal of the transistor MN10 may be connected to the power supply voltage GND. Transistors MP9, MN9, and MN10 may generate a quiescence adjustment signal in the node n6.

The comparator 132_1b may further include a capacitor Cq. One end of the capacitor Cq may be connected to the node n6, and the other end of the capacitor Cq may be connected to the power supply voltage GND. When an output spike signal is activated, the transistor MP9 is turned on, and by a current flowing through the transistor MP9, charges may be accumulated in the capacitor Cq. When the output spike signal is deactivated, the charges accumulated in the capacitor Cq may be discharged through the transistors MN9 and MN10. When the output spike signal is deactivated, the transistor MN9 may be turned on. Depending on the second bias signal, the transistor MN10 may control the rate or duration at which the charges (that is, the quiescence adjustment signal) charged in the capacitor Cq are discharged.

The comparator 132_1b may further include a transistor MN11 which receives the quiescence adjustment signal (the voltage of the node n6) through a gate terminal. A drain terminal of the transistor MN11 may be connected to a node n7, and a source terminal of the transistor MN11 may be connected to the power supply voltage GND. The transistor MN11 may be a pull-down transistor which drives the voltage Vm of the membrane signal with (to) the power supply voltage GND depending on the voltage of the node n6. Depending on the quiescence adjustment signal, the transistor MN11 may electrically connect the node n7 in which the membrane signal is generated to the power supply voltage GND.

The capacitor Cq and the transistors MN9 to MN11 and MP9 may configure a quiescence adjustment circuit 134_1b which lowers the voltage Vm of the membrane signal to the power supply voltage GND. The quiescence adjustment circuit 134_1b may adjust an interval in which the membrane signal is deactivated or an interval in which the output spike signal is deactivated. A quiescence of the neuron 131_1 may represent a duration (time) during which the voltage Vm of the membrane signal is driven or maintained with the power supply voltage GND corresponding to a reset, or a duration during which the output spike signal is activated and then deactivated. The quiescence may be adjusted based on the second bias signal, the transistor MN10, and a capacity of the capacitor Cq. Even when an input spike signal is activated and operation results are output from the synapses 121 in the quiescence, since the voltage Vm of the membrane signal is maintained as the power supply voltage GND, the operation results may be ignored.

The comparator 132_1b may further include a transistor MP11 which receives the voltage Vspike_out of the output spike signal through a gate terminal. A drain terminal of the transistor MP11 may be connected to the node n7, and a source terminal of the transistor MP11 may be connected to the power supply voltage VDD. The transistor MP11 may be a pull-up transistor which drives the voltage Vm of the membrane signal with the power supply voltage VDD depending on the voltage Vspike_out of the output spike signal. For example, immediately after the output spike signal is activated, the transistor MP11 may be turned on to drive the voltage Vm of a membrane with the power supply voltage VDD, and accordingly, the voltage Vm of the membrane may represent an instantaneous up-swing. The transistor MP11 may electrically connect the node n7 in which the membrane signal is generated to the power supply voltage VDD immediately after the output spike signal is activated.

When the output spike signal is activated, the transistor MP11 is turned on to instantaneously increase the voltage Vm of the membrane, and then the transistor MN11 is turned on to drive the voltage Vm of the membrane with the power supply voltage GND corresponding to a reset state. When the voltage Vm of the membrane is lowered to the power supply voltage GND, new operation signals may be received from the synapses 121.

In an embodiment, the spike neural network circuit 100_1 may further include a voltage generator which generates the first and second bias signals, the leakage signal, and the threshold signal. Each of voltage levels of the first to second bias signals, the leakage signal, and the threshold signal may be pre-defined, or programmed in the voltage generator.

In an embodiment, types of the transistors of FIG. 4 are not limited to those shown in FIG. 3. Also, the logic value of the output spike signal is not limited to the example described above.

Figure 5:
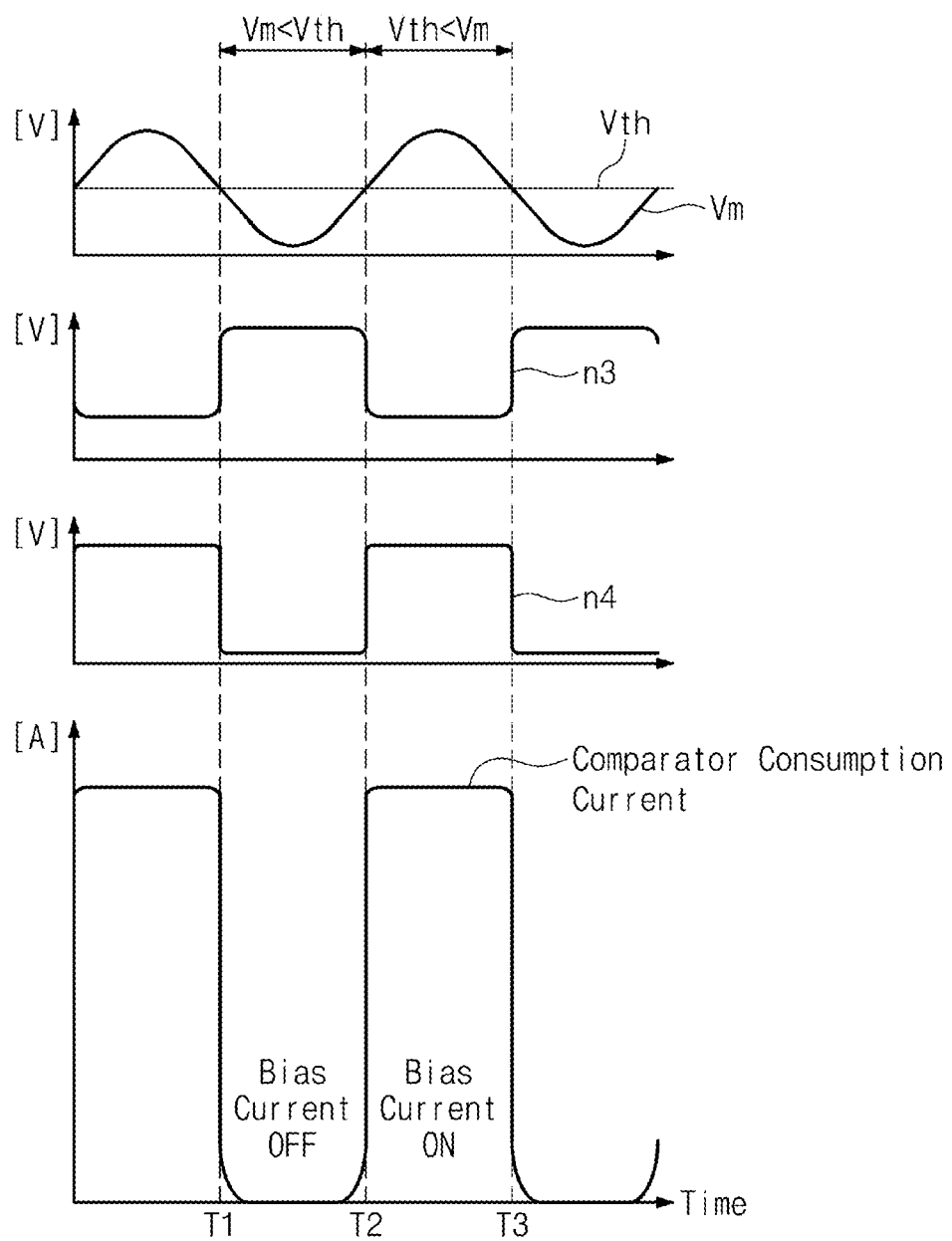
FIG. 5 exemplarily illustrates a timing diagram showing an operation of a comparator of FIG. 4.

FIG. 5 exemplarily illustrates a timing diagram showing the operation of a comparator of FIG. 4. FIG. 5 will be described with reference to FIG. 4. In FIG. 5, the horizontal axis represents duration, and the vertical axis may represent either voltage or current.

Exemplarily, the membrane signal may be a sine wave. In an interval between T1 and T2 time points, the voltage Vm of the membrane signal may be lower than the voltage Vth of the threshold signal, the logic value of the voltage of the node n3 may be the second value, the logic value of the voltage of the node n4 may be the first value, and the bias current of the comparator 132_1b may not be supplied. When the voltage Vm of the membrane signal is lower than the sum of threshold voltages of the transistors MN7 and MN2, the bias current of the comparator 132_1b may not be supplied.

In an interval between T2 and T3 time points, the voltage Vm of the membrane signal may be higher than the voltage Vth of the threshold signal, the logic value of the voltage of the node n3 may be the first value, the logic value of the voltage of the node n4 may be the second value, and the bias current of the comparator 132_1b may be supplied. When the voltage Vm of the membrane signal is greater than the sum of threshold voltages of the transistors MN7 and MN2, the bias current of the comparator 132_1b may be supplied. The power consumption of the comparator 132_1b in the section between the T1 and T2 time points may be less than the power consumption of the comparator 132_1b in the section between the T2 and T3 time points.

Figure 6:
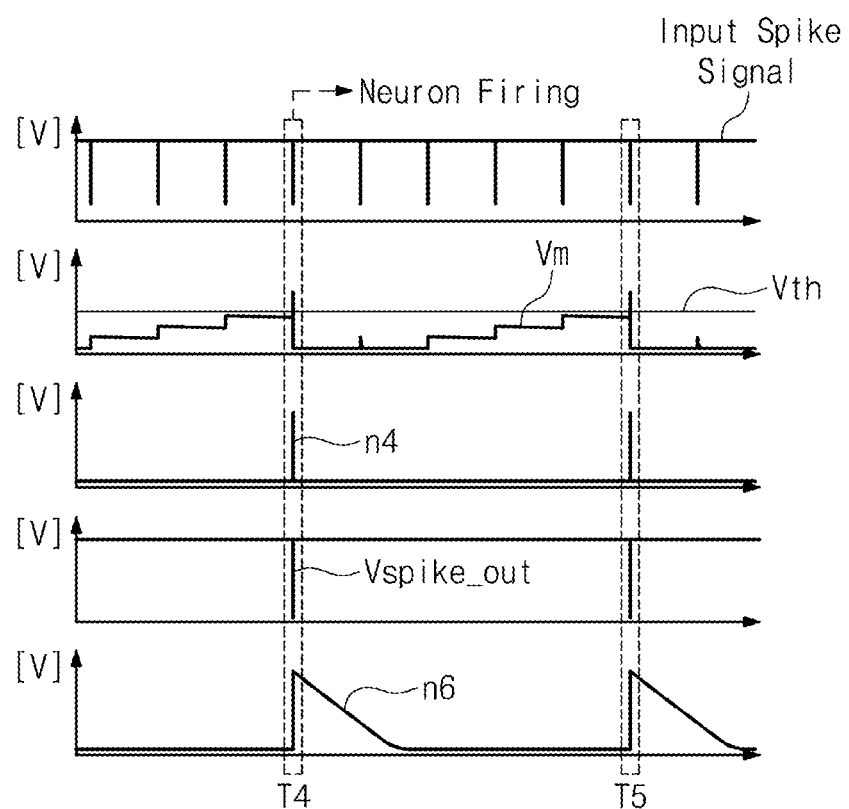
FIG. 6 exemplarily illustrates a timing diagram showing an operation of the comparator of FIG. 4.

FIG. 6 exemplarily illustrates a timing diagram showing the operation of the comparator of FIG. 4. FIG. 6 will be described with reference to FIG. 4. In FIG. 6, the horizontal axis represents duration (time), and the vertical axis may represent voltage. Referring to FIG. 6, as the input spike signal is repeatedly activated and deactivated, the voltage Vm of the membrane signal may be gradually increased.

Near a T4 time point, when the voltage Vm of the membrane signal reaches the voltage Vth of the threshold signal, the voltage of the node n4 of the comparator 132_1b is activated and the voltage of the voltage Vspike_out of the output spike signal may be activated. Near the T4 time point, the voltage Vm of the membrane signal may represent an instantaneous up-swing by the transistor MP11. After the voltage Vspike_out of the output spike signal is activated, the voltage Vm of the membrane signal may be lowered to the power supply voltage GND and deactivated by the transistor NM11. After the voltage of the voltage Vspike_out of the output spike signal is activated, the voltage (a pause adjustment signal) of the node n6 may be discharged by the transistor NM10 operated based on the second bias signal.

Again, as the input spike signal is repeatedly activated and deactivated, the voltage Vm of the membrane signal may be gradually increased. Near a T5 time point, when the voltage Vm of the membrane signal reaches the voltage Vth of the threshold signal, the voltage of the node n4 of the comparator 132_1b is activated and the voltage of the voltage Vspike_out of the output spike signal may be activated. Referring to FIG. 6, an interval in which the output spike signal is activated may be much shorter than an interval in which the output spike signal is deactivated.

Figure 7:
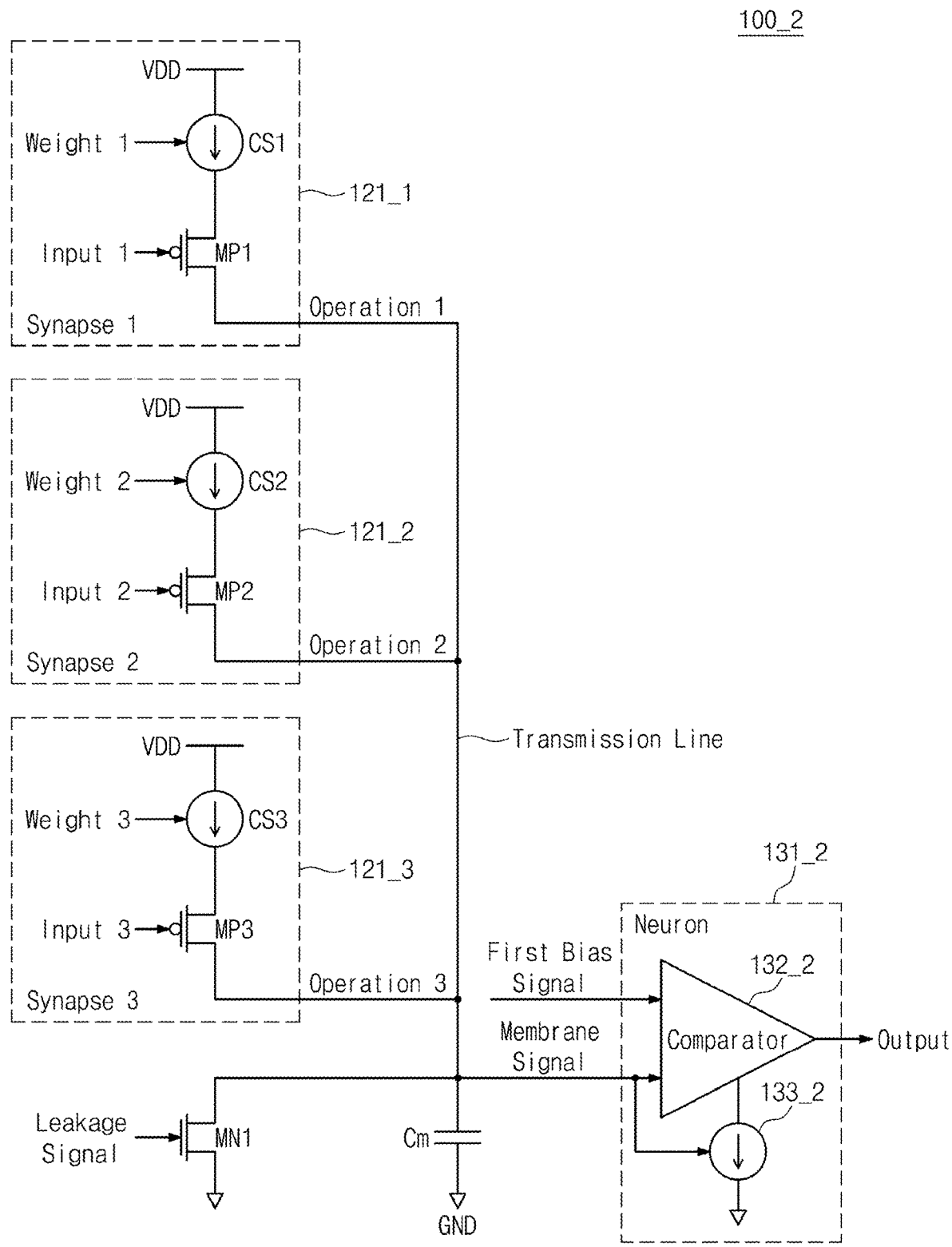
FIG. 7 is a block diagram more specifically illustrating the synapses of the synaptic circuit and the neuron of the neuron circuit of FIG. 1.

FIG. 7 is a block diagram more specifically illustrating the synapses of the synaptic circuit and the neurons of the neuron circuit of FIG. 1. FIG. 7 will be described with reference to FIG. 1 and FIG. 2. A spike neural network circuit 100_2 may include the first to third synapses 121_1 to 121_3, the capacitor Cm, and the transistor MN1. The spike neural network circuit 100_2 is the spike neural network circuit 100 of FIG. 1. For convenience of description, the axon circuit 110 is not shown, and only some synapses 121_1, 121_2, and 121_3 of the synaptic circuit 120 are shown. The first to third synapses 121_1 to 121_3, the capacitor Cm, and the transistor MN1 of the spike neural network circuit 100_2 are substantially the same as the first to third synapses 121_1 to 121_3, the capacitor Cm, and the transistor MN1 of the spike neural network circuit 100_1. Differences between the spike neural network circuit 100_2 and the spike neural network circuit 100_1 will be mainly described.

The spike neural network circuit 100_2 may include a neuron 131_2. For convenience of description, only one neuron 131_2 of the neuron circuit 130 is illustrated. The neuron 131_2 may include a comparator 132_2 and a bias circuit 133_2. The neuron 131_1 compares the membrane signal with the threshold signal, but the neuron 131_2 compares the membrane signal with the first bias signal. The first bias signal may be used to generate a bias current of the comparator 132_2 and at the same time, may be provided as the threshold signal of FIG. 2. That is, the first bias signal may be referred to as the threshold signal. The bias circuit 133_2 may conditionally supply the bias current to the comparator 132_2 depending on the membrane signal. Except that the neuron 131_2 uses the first bias signal as the threshold signal, the neuron 131_2 may be operated similarly to the neuron 131_1.

Figure 8:
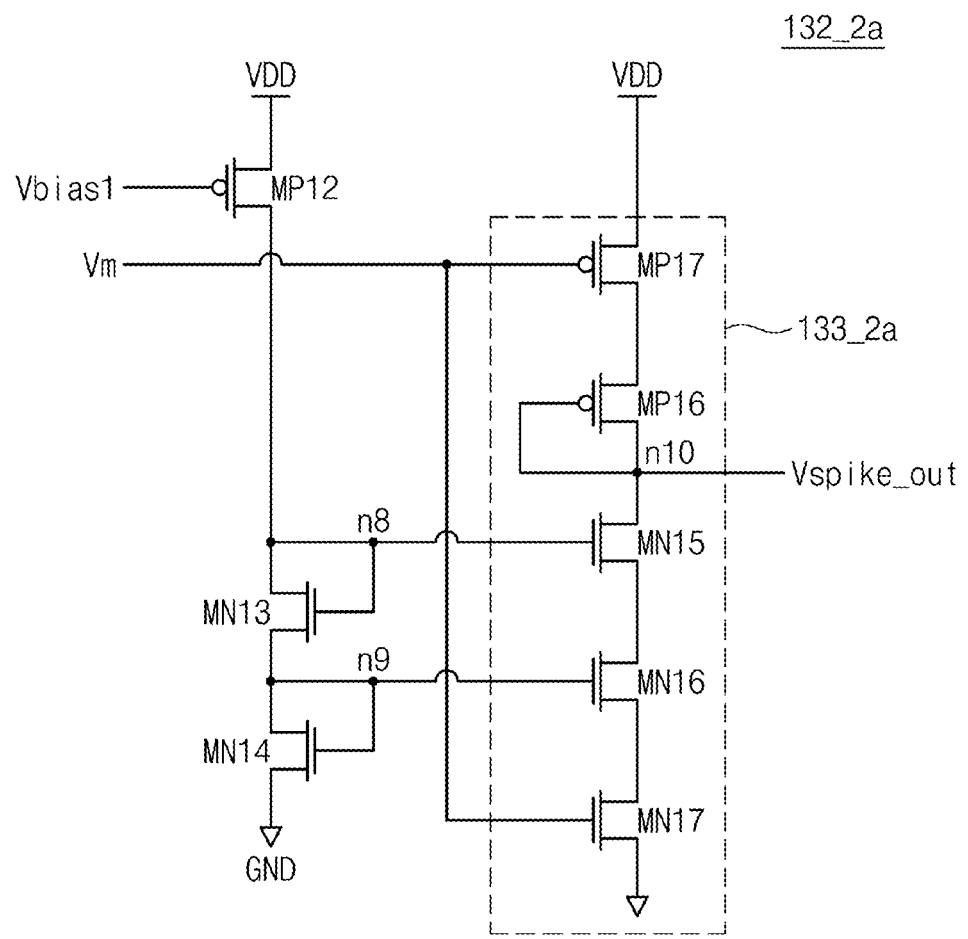
FIG. 8 exemplarily illustrates a block diagram of a comparator of FIG. 7.

FIG. 8 exemplarily illustrates a block diagram of the comparator of FIG. 7. FIG. 8 will be described with reference to FIG. 7. A comparator 132_2a may be the comparator 132_2 of FIG. 7, and a bias circuit 133_2a may be included in the comparator 132_2a, or may be the bias circuit 133_2 of FIG. 7.

The comparator 132_2a may include a transistor MP12 which receives the voltage Vbias1 of the first bias signal through a gate terminal. A drain terminal of the transistor MP12 may be connected to a node n8. A source terminal of the transistor MP12 may be connected to the power supply voltage VDD. The transistor MP12 may generate a bias current based on the first bias signal. The transistor MP12 may output the bias current corresponding to the first bias signal to a transistor MN13.

The comparator 132_2a may include transistors MN13 and MN14. The transistor MN13 may receive the bias current corresponding to the first bias signal. A gate terminal and a drain terminal of the transistor MN13 may be connected to each other (diode connection). A source terminal of the transistor MN13 may be connected to a node n9. The transistor MN13 may be connected between the node n8 and the node n9. A transistor MN14 may receive the bias current corresponding to the first bias signal through the transistor MN13. A gate terminal and a drain terminal of the transistor MN14 may be connected to each other (diode connection). A source terminal of the transistor MN14 may be connected to the power supply voltage GND. The transistor MN14 may be connected between the node n9 and the power supply voltage GND. The transistors MN13 and MN14 may copy the bias current corresponding to the first bias signal to the bias circuit 133_2a (current mirroring).

The bias circuit 133_2a may include a transistor MN15 which receives a voltage of the node n8 through a gate terminal and a transistor MN16 which receives a voltage of the node n9 through the gate terminal. A drain terminal of the transistor MN15 may be connected to a node n10. A source terminal of the transistor MN15 may be connected to a drain terminal of the transistor MN16. The drain terminal of the transistor MN16 may be connected to the source terminal of the transistor MN15. A source terminal of the transistor MN16 may be connected to a drain terminal of a transistor MN17. Through the transistors MN15 and MN16, the bias current corresponding to the first bias signal may flow.

Unlike what is shown, the comparator 132_2a may not include the transistors MN13 and MN15. In this case, the drain terminal of the transistor MP12 and the drain terminal of the transistor MN14 may be connected to each other, and the drain terminal of the transistor MN16 and a drain terminal of a transistor MP16 may be connected to each other.

The comparator 133_2a may include the transistor MN17 which receives the voltage Vm of the membrane signal through a gate terminal. A drain terminal of the transistor MN17 may be connected to the source terminal of the transistor MN16. A source terminal of the transistor MN17 may be connected to the power supply voltage GND. The transistor MN17 may be connected between the transistor MN16 and the power supply voltage GND. The transistor MN17 may be turned on or turned off depending on the voltage Vm of the membrane signal. When the voltage Vm of the membrane signal is greater than a threshold voltage of the transistor MN17, the transistor MN17 may be turned on. When the transistor MN17 is turned on, a bias current corresponding to the first bias signal may be supplied to the comparator 132_2a through the transistor MN17, and when the transistor MN17 is turned off, the bias current corresponding to the first bias signal may not be supplied to the comparator 132_2a through the transistor MN2. Only when the transistor MN17 is turned on, a bias current may flow through the transistor MN17, and power may be consumed by the bias current and the power supply voltage VDD.

The bias circuit 133_2a may include the transistor MP16. A gate terminal and a drain terminal of the transistor MP16 may be connected to each other (diode connection), and may be connected to the node n10. A source terminal of the transistor MP16 may be connected to a transistor MP17. The comparator 133_2a may include the transistor MP17 which receives the voltage Vm of the membrane signal through a gate terminal. A source terminal of the transistor MP17 may be connected to the power supply voltage VDD. A drain terminal of the transistor MP17 may be connected to a source terminal of the transistor MP16.

In FIG. 3, the comparator 132_1a compares the voltage Vm of the membrane signal with the voltage Vth of the threshold signal. The comparator 132_2a may compare a current of the membrane signal with a bias current of the first bias signal. Through the transistors MP16 and MP17, a pull-up current depending on the voltage Vm of the threshold signal may be generated. Since the transistors MP16 and MP17 generate the pull-up current, the logic value of the output spike signal Vspike_out may be driven with the second value. Through the transistors MP16 and MP17, a pull-down current (a bias current) depending on the first bias signal may be generated. Since the transistors MN15 and MN16 generate the pull-down current, the logic value of the output spike signal Vspike_out may be driven with the first value. The voltage Vspike_out of the output spike signal may be determined according to the result of comparing the current of the membrane signal with the current of the first bias signal. For example, when the current of the membrane signal becomes smaller than the bias current of the first bias signal or when the current of the membrane signal reaches the bias current of the first bias signal, the logic value of the voltage Vspike_out of the output spike signal is changed from the second value to the first value, so that the output spike signal may be activated and fired. In another example, when the current of the membrane signal becomes greater than the bias current of the first bias signal or the current of the membrane signal reaches the bias current of the first bias signal, the output spike signal may be activated and fired. The output spike signal may be generated in the node n10.

In an embodiment, types of the transistors of FIG. 8 are not limited to those shown in FIG. 8. Also, the logic value of the output spike signal is not limited to the example described above.

Figure 9:
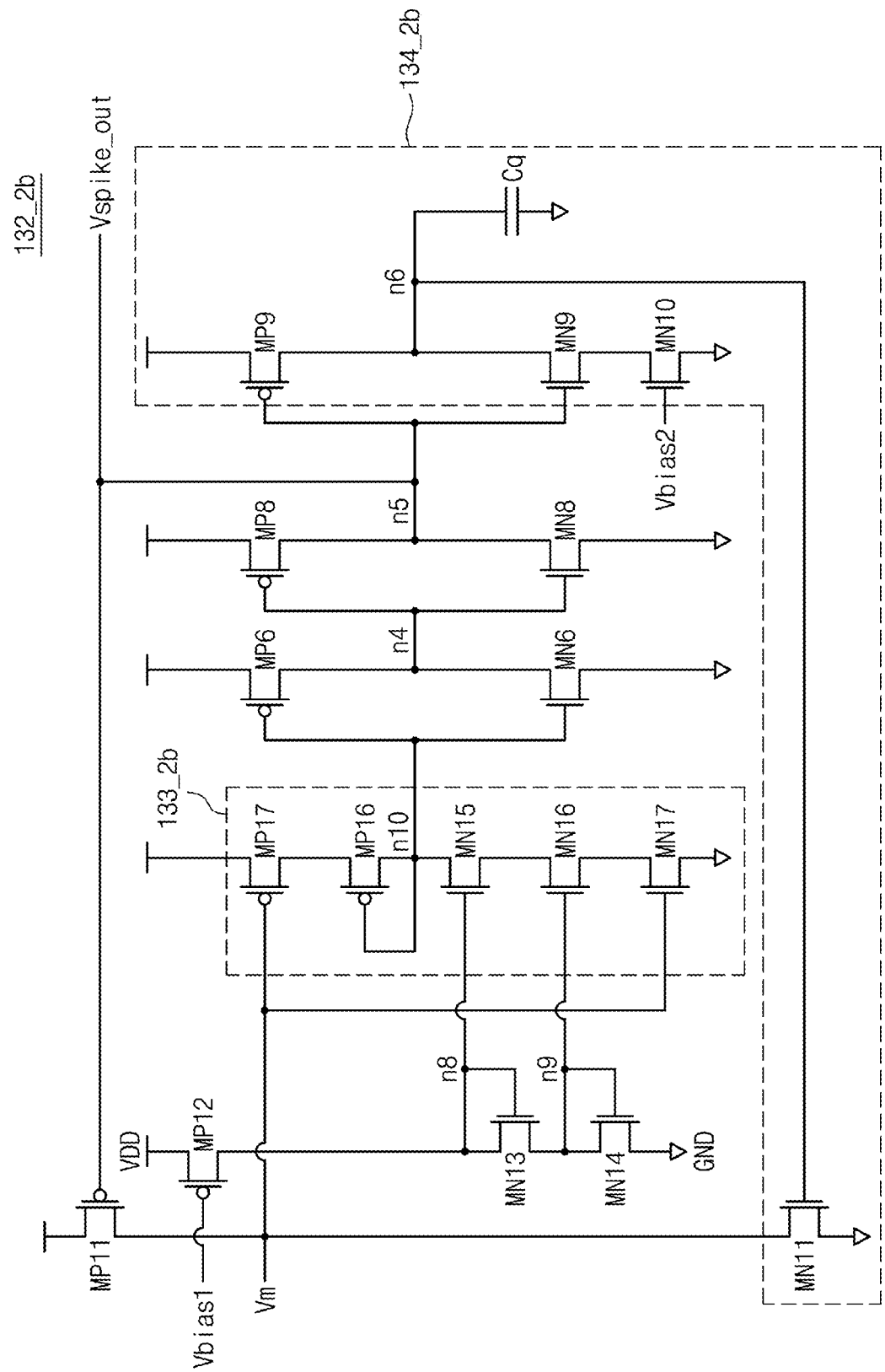
FIG. 9 exemplarily illustrates a block diagram of the comparator of FIG. 7.

FIG. 9 exemplarily illustrates a block diagram of the comparator of FIG. 7. FIG. 9 will be described with reference to FIG. 2 and FIG. 3, and FIG. 7 and FIG. 8. A comparator 132_2b may be the comparator 132_2 of FIG. 7, and a bias circuit 133_2b may be included in the comparator 132_2b, or may be the bias circuit 133_2 of FIG. 7. Differences between the comparator 132_2b and the comparator 132_2a and differences between the comparator 132_2b and the comparator 132_1b will be mainly described, and the description of components having the same reference numerals will be omitted. The transistors MP12, MP16, MP17 and MN13 to MN17 of the comparator 132_2b have been explained with reference to FIG. 8. The transistors MN8 to MN11, MP8, MP9 and MP11 of the comparator 132_2b have been explained with reference to FIG. 4. The transistors MN9 to MN11 and MP9 and the capacitor Cq may constitute a quiescence adjustment circuit 134_2b. The quiescence adjustment circuit 134_2b may be implemented substantially the same as the quiescence adjustment circuit 134_1b.

The comparator 132_2b may include the transistors MN6 and MP6 which constitute an inverter. The transistor MN6 may receive the voltage of the node 10 through a gate terminal. The drain terminal of the transistor MN6 may be connected to the node n4. The source terminal of the transistor MN6 may be connected to the power supply voltage GND. The transistor MP6 may receive the voltage of the node 10 through a gate terminal. The drain terminal of the transistor MP6 may be connected to the node n4. The source terminal of the transistor MP6 may be connected to the power supply voltage VDD.

In an embodiment, types of the transistors of FIG. 9 are not limited to those shown in FIG. 9. Also, the logic value of the output spike signal is not limited to the example described above.

A spike neural network circuit according to an embodiment of the inventive concept may include a comparator operated by a conditional bias current. Accordingly, the power consumption by the spike neural network circuit may be reduced.

The above description relates to specific examples for implementing the inventive concept. The inventive concept present invention will include embodiments that can be simplified or easily changed, as well as the embodiments described above. In addition, the inventive concept will also include techniques that can be easily modified and implemented in the future using the embodiments described above.

What is claimed is:

1. A spike neural network circuit comprising:
   a synapse configured to generate an operation signal based on an input spike signal and a weight; and
   a neuron configured to generate an output spike signal using a comparator configured to compare a voltage of a threshold signal with a voltage of a membrane signal generated based on the operation signal,
   wherein the comparator includes a bias circuit configured to conditionally supply a bias current of the comparator depending on the voltage of the membrane signal,
   wherein the bias current is supplied to the comparator when the voltage of the membrane signal is higher than the voltage of the threshold signal, and the supplying of the bias current to the comparator is blocked when the voltage of the membrane signal is lower than the voltage of the threshold signal, and
   wherein the comparator includes:
   a first transistor and a second transistor that are connected to a first power supply voltage and configured to form a current mirror;
   a third transistor connected between a first node connected to the current mirror and a third node and receiving the threshold signal through its gate terminal;
   a fourth transistor connected between a second node connected to the current mirror and the third node and receiving the membrane signal through its gate terminal;
   a fifth transistor connected between the third node and a fourth node and configured to generate the bias current based on a bias signal; and
   a sixth transistor connected between the fourth node and a second power supply voltage and configured to be turned on or turned off depending on the voltage of the membrane signal, wherein the bias circuit includes the fifth transistor and the sixth transistor.

2. The spike neural network circuit of claim 1, wherein:
   when the sixth transistor is turned on, the bias current of the fifth transistor is supplied through the sixth transistor, and
   when the sixth transistor is turned off, the bias current of the fifth transistor is not supplied.

3. The spike neural network circuit of claim 1, wherein the bias circuit further includes a seventh transistor connected between the sixth transistor and the second power supply voltage.

4. The spike neural network circuit of claim 1, wherein the neuron includes an eighth transistor configured to be turned on when the output spike signal is activated so as to electrically connect a node at which the membrane signal is generated to the first power supply voltage.

5. The spike neural network circuit of claim 1, wherein the neuron includes a quiescence adjustment circuit configured to adjust an interval in which the membrane signal is deactivated.

6. The spike neural network circuit of claim 5, wherein the quiescence adjustment circuit includes:
   a ninth transistor configured to be turned on or turned off depending on the output spike signal and generate a quiescence adjustment signal;
   a tenth transistor connected to a first end of the ninth transistor and connected between the ninth transistor and the second power supply voltage; and
   an eleventh transistor connected to a second end of the ninth transistor and configured to electrically connect a node at which the membrane signal is generated depending on the quiescence adjustment signal to the second power supply voltage.

7. The spike neural network circuit of claim 1, wherein the synapse includes:
   a first transistor configured to receive the weight; and
   a second transistor connected to the first transistor of the synapse and configured to receive the input spike signal, and
   wherein the operation signal is output through the first and second transistors of the synapse.

8. The spike neural network circuit of claim 1, further comprising:
   a membrane capacitor in which the operation signal is accumulated and the membrane signal is generated; and
   a transistor configured to discharge charges accumulated in the membrane capacitor depending on a leakage signal in order to control a rate at which operation signals output from a plurality of synapses including the synapse are accumulated in the membrane capacitor, the leakage signal having a pre-defined voltage.

9. A spike neural network circuit comprising:
   a synapse configured to generate an operation signal based on an input spike signal and a weight; and
   a neuron configured to generate an output spike signal using a comparator configured to compare a current of a membrane signal generated based on the operation signal with a bias current generated based on a bias signal,
   wherein the comparator includes a bias circuit configured to conditionally supply the bias current depending on a voltage of the membrane signal,
   wherein the bias current is supplied to the comparator when the voltage of the membrane signal is higher than a threshold voltage, and the supplying of the bias current to the comparator is blocked when the voltage of the membrane signal is lower than the threshold voltage,
   wherein the bias circuit includes:
   a first transistor connected between a first power supply voltage and a first node and configured to be turned on or turned off depending on the membrane signal;
   a second transistor connected between the first node and an output node through which the output spike signal is generated;
   a third transistor connected to the output node and configured to generate the bias current; and
   a fourth transistor connected between the third transistor and a second power supply voltage and configured to be turned on or turned off based on the voltage of the membrane signal and the threshold voltage.

10. The spike neural network circuit of claim 9, wherein the output spike signal is activated according to a comparison result of the current of the membrane signal with the bias current.

11. The spike neural network circuit of claim 9, wherein:
    when the fourth transistor is turned on, the bias current of the third transistor is supplied through the fourth transistor, and
    when the fourth transistor is turned off, the bias current of the third transistor is not supplied.

12. The spike neural network circuit of claim 9,
    wherein the current of the membrane signal is generated by the first transistor, and the bias current is generated by the third and fourth transistors.

13. The spike neural network circuit of claim 9, wherein the neuron includes a transistor configured to be turned on when the output spike signal is activated so as to electrically connect a node at which the membrane signal is generated to first power supply voltage.

14. The spike neural network circuit of claim 9, wherein the neuron includes a quiescence adjustment circuit configured to adjust an interval in which the membrane signal is deactivated.

15. The spike neural network circuit of claim 14, wherein the quiescence adjustment circuit includes:
    a fifth transistor configured to be turned on or turned off depending on the output spike signal and generate a pause adjustment signal;
    a sixth transistor connected to a first end of the fifth transistor and connected between the fifth transistor and the second power supply voltage; and
    a seventh transistor connected to a second end of the fifth transistor and configured to electrically connect a node at which the membrane signal is generated depending on the quiescence adjustment signal to the second power supply voltage.

16. The spike neural network circuit of claim 9, wherein the synapse includes:
    a first transistor configured to receive the weight; and
    a second transistor connected to the first transistor of the synapse and configured to receive the input spike signal, and
    wherein the operation signal is output through the first and second transistors of the synapse.

17. The spike neural network circuit of claim 9, further comprising:
    a membrane capacitor in which the operation signal is accumulated and the membrane signal is generated; and
    a transistor configured to discharge charges accumulated in the membrane capacitor depending on a leakage signal in order to control a rate at which operation signals output from a plurality of synapses including the synapse are accumulated in the membrane capacitor, the leakage signal having a pre-defined voltage.

* * * * *